United States Patent
Xu et al.

(10) Patent No.: US 10,340,811 B2
(45) Date of Patent: Jul. 2, 2019

(54) INVERTER SWITCHING DEVICES WITH GATE COILS TO ENHANCE COMMON SOURCE INDUCTANCE

(71) Applicant: FORD GLOBAL TECHNOLOGIES, LLC, Dearborn, MI (US)

(72) Inventors: Zhuxian Xu, Novi, MI (US); Chingchi Chen, Ann Arbor, MI (US); Michael W. Degner, Novi, MI (US)

(73) Assignee: FORD GLOBAL TECHNOLOGIES, LLC, Dearborn, MI (US)

( * ) Notice: Subject to any disclaimer, the term of this patent is extended or adjusted under 35 U.S.C. 154(b) by 193 days.

(21) Appl. No.: 15/361,898

(22) Filed: Nov. 28, 2016

(65) Prior Publication Data
US 2018/0152113 A1    May 31, 2018

(51) Int. Cl.
*H01L 23/495* (2006.01)
*H02M 7/00* (2006.01)
(Continued)

(52) U.S. Cl.
CPC ........ *H02M 7/003* (2013.01); *H01L 23/3107* (2013.01); *H01L 23/49503* (2013.01); *H01L 23/49531* (2013.01); *H01L 23/49537* (2013.01); *H01L 23/49562* (2013.01); *H01L 23/49575* (2013.01); *H01L 27/0207* (2013.01); *H01L 27/0647* (2013.01); *H02M 7/537* (2013.01);
(Continued)

(58) Field of Classification Search
CPC ........ H02M 2001/0054; H02M 1/088; H02M 7/003; H02M 7/537; H02M 2001/0029; H02M 1/08; H02M 2001/341; H01L 23/495; H01L 23/49506; H01L 23/49531
See application file for complete search history.

(56) References Cited

U.S. PATENT DOCUMENTS

| 5,616,955 A | 4/1997 | Yamada et al. |
| 6,365,918 B1 | 4/2002 | Litwin et al. |
(Continued)

OTHER PUBLICATIONS

Yang, Bo and Jason Zhang, "Effect and utilization of common source inductance in synchronous rectification." Twentieth Annual IEEE Applied Power Electronics Conference and Exposition, 2005. APEC 2005, vol. 3. IEEE, 2005.
(Continued)

*Primary Examiner* — Jue Zhang
*Assistant Examiner* — Lorena D Bruner
(74) *Attorney, Agent, or Firm* — David B. Kelley; MacMillan, Sobanski & Todd, LLC

(57) ABSTRACT

A selectable increase in the common source inductance is obtained by a layout for a power module used for a half-bridge phase leg in an inverter for an electrically-driven vehicle. The power module comprises a pair of transistor dies connected to positive, negative, and AC conductive tracks for carrying bridge currents. The module includes a pair of gate drive pins and a pair of gate drive coils connecting a respective pin and die. The gate drive coils are disposed in a region between the positive and negative tracks containing a flux generated by the currents having a locally greatest rate of change. The coils may preferably be comprised of traces on an auxiliary printed circuit board incorporated in the module. The gate drive pins can be on the gate side or the emitter side of the transistor dies.

20 Claims, 8 Drawing Sheets

(51) Int. Cl.
*H01L 23/31* (2006.01)
*H01L 27/02* (2006.01)
*H01L 27/06* (2006.01)
*H02M 7/537* (2006.01)

(52) U.S. Cl.
CPC .............. *H01L 2224/05554* (2013.01); *H01L 2224/32245* (2013.01); *H01L 2224/48247* (2013.01); *H01L 2224/73265* (2013.01)

(56) References Cited

U.S. PATENT DOCUMENTS

| | | | |
|---|---|---|---|
| 6,424,550 B2 * | 7/2002 | Grundl | H01L 25/0655 |
| | | | 257/E25.012 |
| 7,705,443 B2 | 4/2010 | Yokomae et al. | |
| 8,053,864 B2 | 11/2011 | Nakajima et al. | |
| 8,431,973 B2 | 4/2013 | Takagi | |
| 9,087,817 B2 | 7/2015 | Michikoshi et al. | |
| 9,819,338 B2 * | 11/2017 | Otake | H03K 17/04106 |
| 2014/0203849 A1 * | 7/2014 | Richardson | H03K 17/0424 |
| | | | 327/109 |
| 2017/0353177 A1 * | 12/2017 | Xu | H02M 1/08 |
| 2018/0123478 A1 * | 5/2018 | Xu | H02M 7/003 |

OTHER PUBLICATIONS

Ichikawa et al, Modules for Hybrid Vehicle Motor Driving, Fuji Electric Review, vol. 55, No. 2, pp. 46-50, 2009.

* cited by examiner

INVERTER SWITCHING DEVICES WITH GATE COILS TO ENHANCE COMMON SOURCE INDUCTANCE

CROSS REFERENCE TO RELATED APPLICATIONS

Not Applicable.

STATEMENT REGARDING FEDERALLY SPONSORED RESEARCH

Not Applicable.

BACKGROUND OF THE INVENTION

The present invention relates in general to power switching devices in an inverter bridge, and, more specifically, to inverter drive systems for electrified vehicles using discrete power switching devices with high switching efficiency.

Electric vehicles, such as hybrid electric vehicles (HEVs), plug-in hybrid electric vehicles (PHEVs), and battery electric vehicles (BEVs), use inverter-driven electric machines to provide traction torque. A typical electric drive system may include a DC power source (such as a battery pack or a fuel cell) coupled by contactor switches to a variable voltage converter (VVC) to regulate a main bus voltage across a main DC linking capacitor. An inverter is connected between the main buses and a traction motor in order to convert the DC bus power to an AC voltage that is coupled to the windings of the motor to propel the vehicle.

The inverter includes transistor switching devices (such as insulated gate bipolar transistors, IGBTs) connected in a bridge configuration with a plurality of phase legs. A typical configuration includes a three-phase motor driven by an inverter with three phase legs. An electronic controller turns the switches on and off in order to invert a DC voltage from the bus to an AC voltage applied to the motor. The inverter may pulse-width modulate the DC link voltage in order to deliver an approximation of a sinusoidal current output to drive the motor at a desired speed and torque. Pulse Width Modulation (PWM) control signals applied to the gates of the IGBTs turn them on and off as necessary so that the resulting current matches a desired current.

Because each phase leg of the inverter has a pair of upper and lower switching transistors connected across the DC link, it is important that both devices in a leg not be conducting (i.e., turned-on) simultaneously. A short time interval (known as dead-time) is typically inserted in the PWM switching signals during which both the upper and lower switching devices of a phase leg are turned off in order to prevent such shoot-through.

Common source inductance refers to an inductance shared by the main power loop (i.e., the drain-to-source or collector-to-emitter power output of the transistor) and the gate driver loop (i.e., gate-to-source or gate-to-emitter) in a power switching transistor. The common source inductance carries both the device output current (e.g., drain-to-source or collector-to-emitter current) and the gate charging/discharging current. A current in the output (power loop) portion of the common source inductance modifies the gate voltage in a manner that reinforces (e.g., speeds up) the switching performance. For a switching bridge, the reduced switching time may be desirable since it may have an associated reduction in the energy consumed (i.e., lost) during the switching transition. Modeling of circuit voltages, currents, and switching operation can determine an optimal magnitude for the common source inductance. It would be desirable to methods and apparatus wherein any identified inductance can be built into an inverter in a simple manner and at a low cost.

SUMMARY OF THE INVENTION

In one aspect of the invention, a half-bridge power module comprises a pair of transistor connected to positive, negative, and AC conductive tracks for carrying bridge currents. The module includes a pair of gate drive pins and a pair of gate drive coils connecting a respective pin and die. The gate drive coils are disposed in a region between the positive and negative tracks containing a flux generated by the currents having a locally greatest rate of change.

DETAILED DESCRIPTION OF PREFERRED EMBODIMENTS

Figure 1:
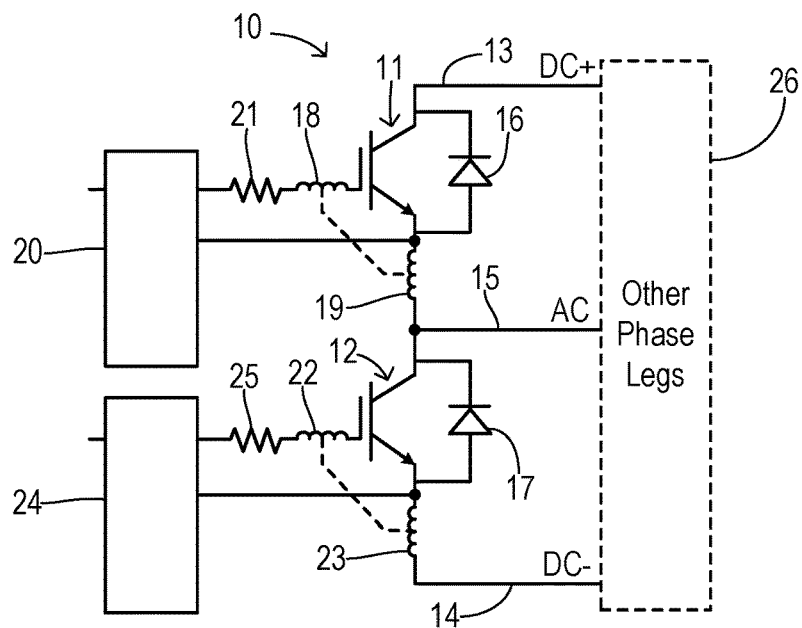
FIG. 1 is a schematic diagram showing an equivalent circuit for a phase leg of an inverter having a pair of IGBTs subject to a common source inductance.

Common source inductance is an inductance shared by a main power loop and a gate driver loop for a transistor switching device. It usually arises from parasitic inductances associated with the device packaging and traces on printed circuit boards. In the context of switching bridges used for DC to AC power conversion, the presence of common source inductance can be beneficial. FIG. 1 shows an example of a phase leg 10 of the type often used in an inverter drive system in an electrified vehicle for driving an electric motor, wherein an upper transistor 11 is shown as an IGBT with upper gate, collector, and emitter terminals. Other types of semiconductor devices could be used, such as a MOSFET. As used herein, the gate, collector, and emitter terminals of an IGBT also refer to gate, drain, and source terminals of a MOSFET. A lower transistor 12 has lower gate, collector, and emitter terminals is connected in series with upper transistor 11 between a positive bus 13 and a negative bus 14 to define an intermediate junction 15. Anti-parallel diodes 16 and 17 are connected across transistors 11 and 12. Phase leg 10 is connected to other phase legs 26 comprised of power modules in an inverter bridge configuration to convert DC bus power to an AC voltage for coupling to the windings of a motor to propel a vehicle.

The upper gate and emitter terminals create an upper common source inductance comprised of a gate loop inductance 18 magnetically coupled to a power loop (i.e., emitter-side) inductance 19. A gate drive circuit 20 and a gate resistor 21 are coupled to the gate terminal in order to control the switching of upper transistor 11. The lower gate and emitter terminals create a lower common source inductance comprised of a gate loop inductance 22 magnetically coupled to a power loop inductance 23. A gate drive circuit 24 and a gate resistor 25 are coupled to the gate terminal in order to control the switching of lower transistor 12.

Figure 2:
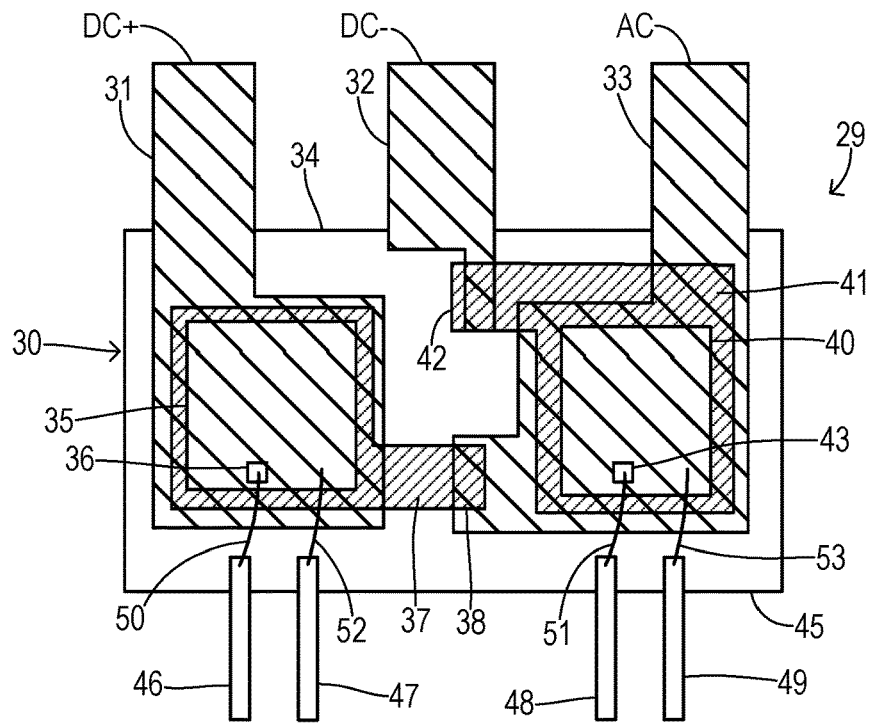
FIG. 2 is a plan view of a transfer-molded power module (TPM) having a pair of IGBTs and an electrode structure for minimizing common source inductance.

FIG. 2 shows a transfer-molded power module (TPM) 29 configured to have a minimal common source inductance. The 2-in-1 module carries a pair of switching transistors which are connected for implementing a phase leg of the inverter bridge. Specifically, a molded body 30 carries a plurality of conductive traces or lead frame elements 31, 32, and 33 which extend beyond an edge 34 of body 30 to form power terminals for connecting with the positive bus DC+, the negative bus DC−, and the phase leg output AC, respectively. A first (upper) IGBT 35 is a semiconductor device formed as a die having a collector terminal or pad formed on a bottom surface which is soldered to trace 31. The upper surface of the die provides a gate terminal/pad 36 while the area around pad 36 provides an emitter terminal/pad which is soldered to one end of a bonded lead plate or tab 37. A second end 38 of plate 37 is soldered to trace 33 to connect the emitter of IGBT 35 to the collector of a second (lower) IGBT 40 and to the AC phase leg output. An upper surface of the die of IGBT 40 provides a gate terminal/pad 43 while the area around pad 43 provides an emitter terminal/pad which is soldered to one end of a bonded lead plate or tab 41. A second end 42 of plate 41 is soldered to trace 32 in order to connect the emitter of IGBT 40 to the negative bus DC−. Traces 31-33 and plates 37 and 41 are all electrically insulated from each other and held in place by molded body 30 (which may be comprised of an epoxy resin).

A group of connector pins extend beyond a second edge 45 of body 30, including gate pins 46 and 48 and Kelvin emitter pins 47 and 49. Bonded jumper wires 50 and 51 connect gate pins 46 and 48 to gate terminals 36 and 43, respectively. Bonded jumper wires 52 and 53 connect Kelvin emitter pins 47 and 49 to the emitter pads of IGBTs 35 and 40, respectively. The Kelvin emitter pins are arranged so that they do not carry (i.e., are perpendicular with) the output currents of the IGBTs.

Figure 3:
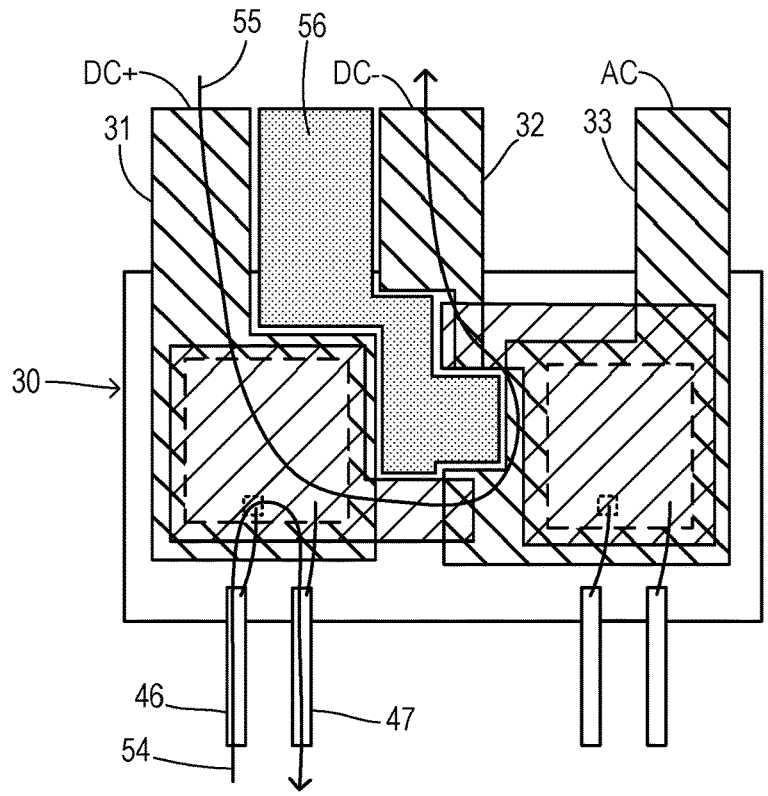
FIG. 3 is a plan view of the transfer-molded power module (TPM) of FIG. 2 indicating a gate loop and a power loop associated with a common source inductance.

FIG. 3 shows a gate loop 54 where gate current flows for IGBT 35 and a power loop 55 including the main bus currents. Loops 54 and 55 have minimal overlap, which means that the common source inductance is low. A region 56 between conductive tracks 31 and 32 for the positive and negative buses contains a magnetic flux generated by the phase leg output currents exhibiting a locally greatest rate of change. During switching transients of the IGBTs, a large di/dt occurs at the DC+ and DC− terminals while current at the AC terminal changes relatively slowly. Because region 56 corresponds to the highest rate of change in the magnetic flux being generated by the IGBT currents, it has the greatest potential for generating a common source inductance. But since gate loop 54 does not overlap with region 56, the coupling between the IGBT input and output currents is low.

The magnitude of the gate loop inductance and/or the power loop inductance and the degree of mutual coupling between them can be easily manipulated (e.g., enhanced) by selecting an appropriate layout and/or including added overlapping coils in PCB traces forming conductive paths to the transistor gates or emitters in order to obtain a desired common source inductance. In the present invention, the ability to obtain adequate coupling between a gate loop and a power loop is improved by placing one or more gate coils is close proximity to region 56 (i.e., having the gate coils disposed near the area between the conductive paths between the IGBTs and the positive and negative buses).

Figure 4:
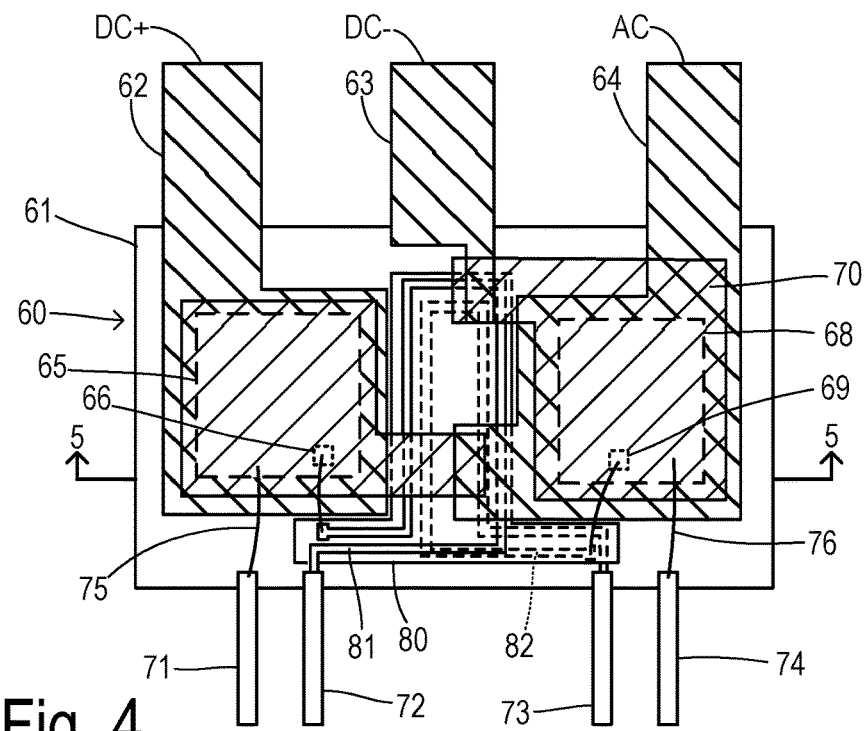
FIG. 4 is a plan view of a transfer-molded power module (TPM) according to one embodiment of the invention wherein gate coils enhance a common source inductance.
Figure 5:
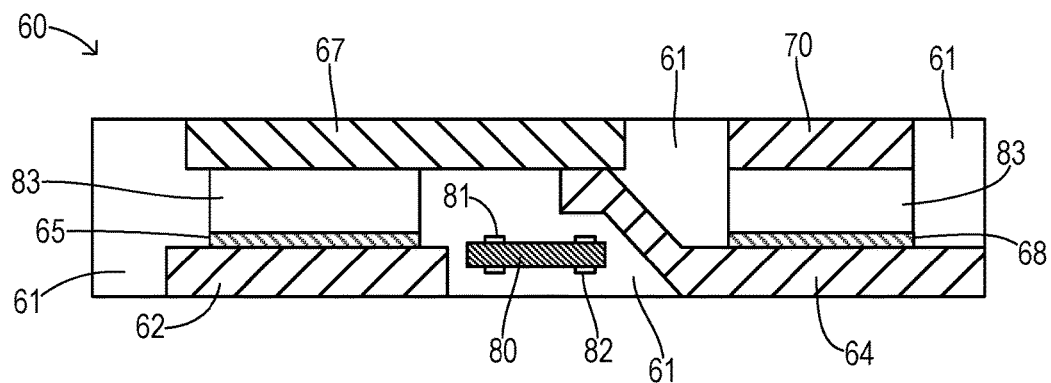
FIG. 5 is a cross section of the power module along line 5-5 of FIG. 4.

FIGS. 4 and 5 show a 2-in-1 transfer-molded power module (TPM) 60 wherein an overmolded body 61 carries a plurality of conductive tracks 62, 63, and 64 of a lead frame to form power terminals for connecting with the positive bus DC+, the negative bus DC−, and the phase leg output AC, respectively. An upper IGBT 65 has a collector terminal or pad formed on a bottom surface which is soldered to track 62. The upper surface of IGBT 65 provides a gate terminal/pad 66 while the area around pad 66 provides an emitter terminal/pad which is soldered to one end of a bonded lead plate or tab 67. Plate 67 is soldered to track 64 to connect the emitter of IGBT 65 to the collector of a lower IGBT 68 and to the AC phase leg output. An upper surface of IGBT 68 provides a gate terminal/pad 69 while the area around pad 69 provides an emitter terminal/pad which is soldered to one end of a bonded lead plate or tab 70. Plate 70 is also soldered to trace 63 in order to connect the emitter of IGBT 68 to the negative bus DC−. Tracks 62-64 and plates 67 and 70 are all electrically insulated from each other by body 61. Copper spacers 83 may be used to connect the dies and lead frame.

A Kelvin emitter pin 71 and a gate pin 72 are provided for IGBT 65. A gate 73 and a Kelvin emitter pin 74 are provided for IGBT 68. Bonded jumper wires 75 and 76 connect emitter pins 71 and 74 to the emitter pads of IGBTs 65 and 68, respectively. Gates coils are connected between gate pins 72 and 73 and gate pads 66 and 69, respectively, as follows. An auxiliary printed circuit board (PCB) 80 which may be implemented as a flexible PCB is shown in FIGS. 4 and 5 wherein a planar T-shaped substrate carries a first gate coil 81 on an upper surface and a second gate coil 82 on a lower surface formed by conductive traces following a loop pattern. PCB 80 is disposed in the region between the positive and negative tracks 62 and 63 in order to expose coils 81 and 82 to the magnetic flux generated by the currents that flow to or from the DC+ and DC− buses, wherein the flux has a locally greatest rate of change. Since the flux is perpendicular to the planar direction of module 60, PCB 80 can be directly between tracks 81 and 82 or can be slightly perpendicularly offset in the direction of the flux and still remain in such region. The voltage magnetically induced in the gate loop by the current in the power loop is proportional to the rate of change of the magnetic flux. By locating the gate coils in the identified region, an adequate coupling is easily achieved. By adjusting the size of the coils and/or adding turns to the coils, the common source inductance can be tuned to any needed magnitude.

One end of gate coil 81 is soldered to gate pin 72 and the other end is connected to gate pad 66 by a bonded jumper wire. One end of gate coil 82 is soldered to gate pin 73 and the other end is connected to gate pad 69 by a bonded jumper wire.

Figure 6:
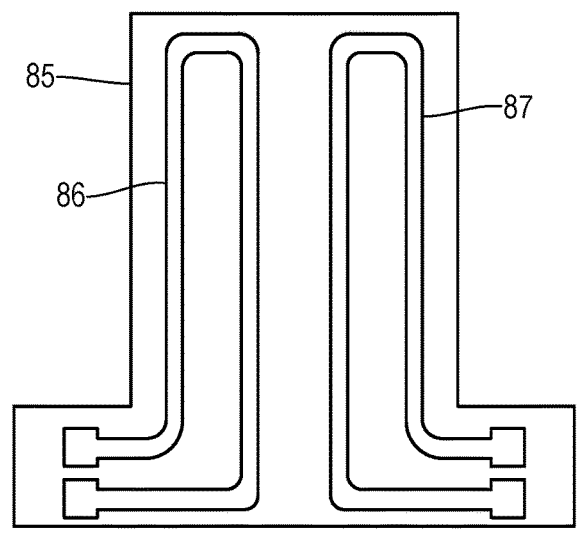
FIG. 6 is a plan view of the auxiliary printed circuit board of FIG. 4 for implementing the gate coils.

By locating gate coils 81 and 82 on opposite sides of auxiliary PCB 80, a compact structure is obtained while enabling a large common source inductance value. In the event that parasitic capacitance between the gate coils was to be great enough to be a concern, the gate coils can be arranged so that they do not overlap with one another. For example, FIG. 6 shows another embodiment of an auxiliary PCB 85 having a first gate coil 86 and a second gate coil 87 which can be formed by conductive tracks on the same surface. The ends of the conductive tracks can include enlarged bonding pads to facilitate the connection of gate coils 86 and 87 to the transistors and/or gate pins of the power module.

Figure 7:
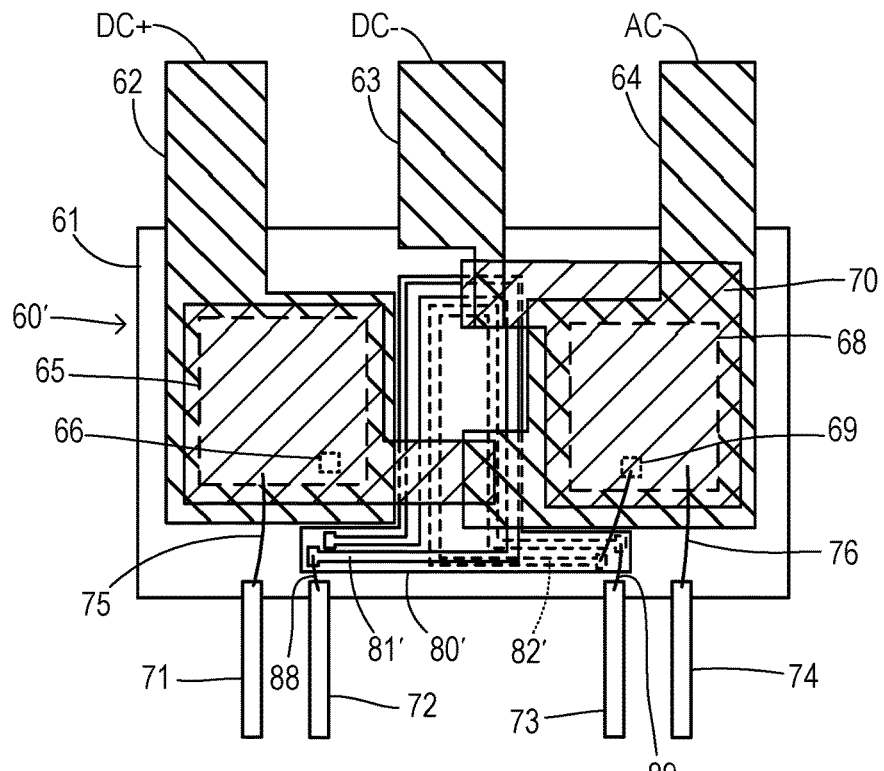
FIG. 7 is a plan view of another embodiment of a transfer-molded power module of the present invention.

Gate pins 72 and 73 could alternatively be connected to the respective gate coils by bonded jumper wires as shown in FIG. 7. Thus, a power module 60' includes a modified auxiliary PCB 80' with gate coils 81' and 82' adapted to connect to gate pins 72 and 73 via bonded wires 88 and 89.

Figure 8:
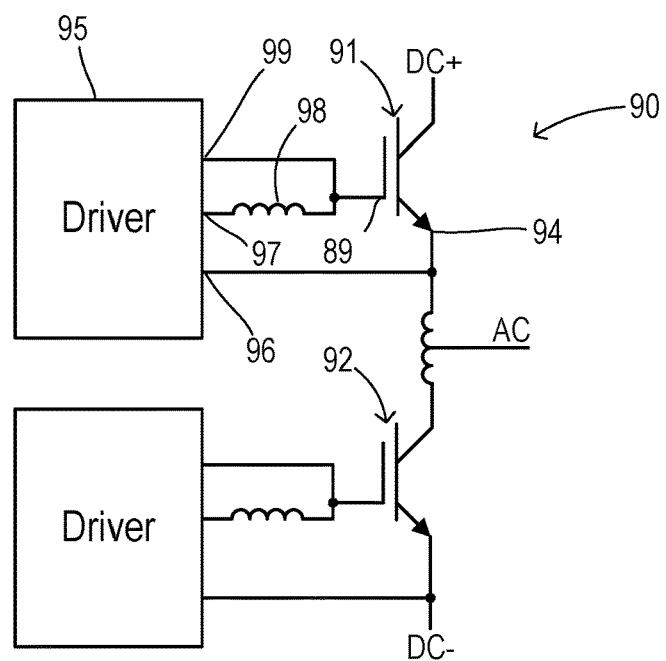
FIG. 8 is a schematic diagram for a power module wherein each transistor includes a separate gate connection bypassing a gate coil for use with an active clamp.

In some applications of the power module, it may be desirable to provide circuit protection functions such as an active gate clamping function wherein a MOSFET or other transistor is used to selectably tie the gate terminal of one of the IGBTs to the respective emitter to keep the IGBT turned off even when voltage transients may be present. However, the enhanced gate inductance introduced by the gate coils may interfere with such an active clamping function. Therefore, an added gate terminal can used as shown in FIG. 8 wherein a phase leg 90 employs upper and lower transistors 91 and 92 which are contained in a power module. Since the components associated with each transistor are essentially the same, only the components for transistor 91 will be described. Transistor 91 has a gate terminal 93 and a Kelvin emitter terminal 94. A gate driver 95 (such as an SP001080574 IGBT Driver IC from Infineon Technologies AG of Munich Germany) has a terminal 96 connected to Kelvin emitter terminal 94. Driver 95 has terminals 97 and 99 each connected to gate terminal 93. Terminal 99 is directly connected to gate terminal 93 and terminal 97 is connected via the enhanced common source inductance 98. Thus, terminal 97 is used by driver 95 to control the switching state of IGBT 91 and uses terminal 99 to actively clamp IGBT 91 into an OFF state.

Figure 9:
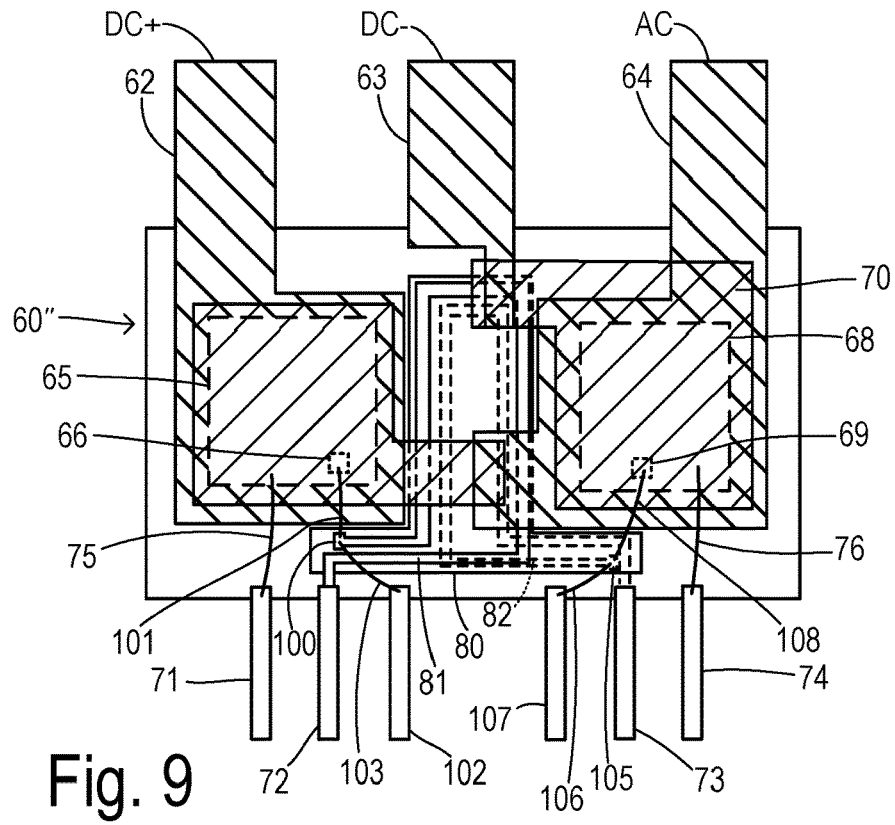
FIG. 9 is a plan view of a transfer-molded power module (TPM) showing a layout to provide the circuit shown in FIG. 8.

The circuit of FIG. 8 is embodied in a TPM power module 60" shown in FIG. 9. Gate coil 81 on auxiliary PCB 80 has a bonding pad 100 at one end. A bonded wire 101 connects pad 100 to gate pad 66 on IGBT 65. A second bonded wire 103 further connects pad 100 to a gate clamping pin 102. Likewise, gate coil 82 has a bonding pad 105 connected to a gate clamping pin 107 by a bonded wire 106 and to gate pad 69 on IGBT 68 by a bonded wire 108. Thus, clamping pins 102 and 107 are connected to the respective IGBT gates bypassing the gate coils.

Figure 10:
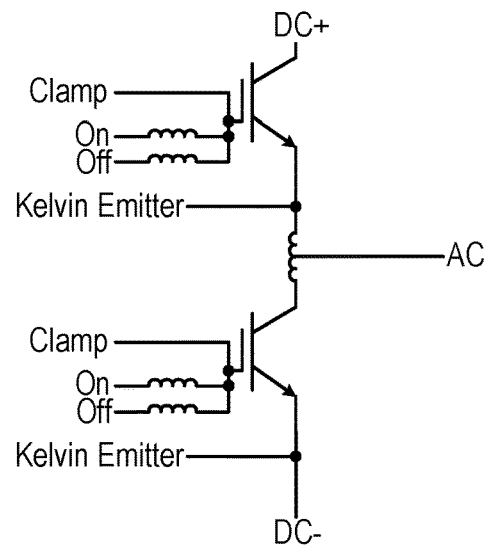
FIG. 10 is a schematic diagram showing an embodiment having multiple gate control pins for each transistor so that different common source inductance is provided for turning on and turning off the transistor.

Another feature that can be used in the present invention is to provide different common source inductance values for device turn-on and device turn-off. In such cases, the device may preferably include multiple gate control pins. One pin is used to control turn-on switching behavior, and the other is used to control turn-off switching behavior. Each gate control pin may have a gate coil of different size, different number of winding turns, or different locations to achieve unique common source inductance for on and off. The gate coils for the same device can share common parts of the windings to save space. For example, an embodiment of the invention in FIG. 10 uses a pair of gate turn-on pins for turning on the transistors and a pair of gate turn-off pins for turning off the transistors. Each gate coil may include a plurality of turns to adapt the common source inductance to provide a desired performance for turn-on and turn-off. Furthermore, a pair of gate clamping pins are provided for bypassing all of the added inductances.

Figure 11:
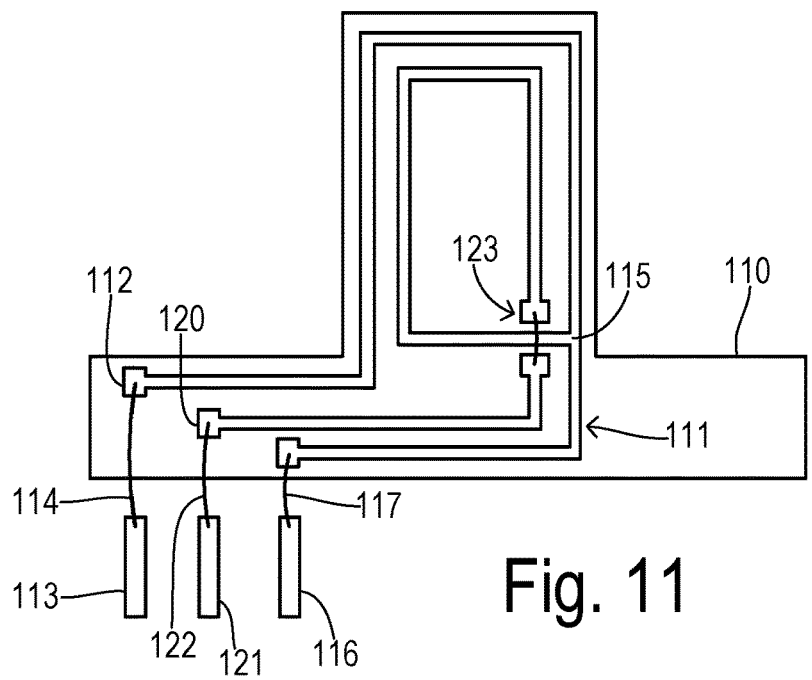
FIG. 11 is a plan view of an auxiliary printed circuit board providing separate gate turn-on and gate turn-off connections providing different values of common source inductance.

FIG. 11 shows an auxiliary flex PCB 110 carrying circuit traces forming a multi-turn, multi-tap gate coil 111 for separate turn-on and turn-off inductances. A bonding pad 112 at one end of coil 111 connects to an IGBT gate pad (not shown) and is connected to a clamp pin 113 by a bonded wire 114. An intermediate tap 115 in coil 111 is connected to a gate turn-on pin 116 via a bonded wire 117. Only about one winding turn is present between pin 116 and pad 112, so that a first common source inductance is available during turn on. A second end 120 of coil 111 is connected to a gate turn-off pin 121 via a bonded wire 122. A jumper 123 is used to complete a second turn between pin 121 and pad 112, so that a second common source inductance which is greater than the first common source inductance is available during turn off.

Figure 12:
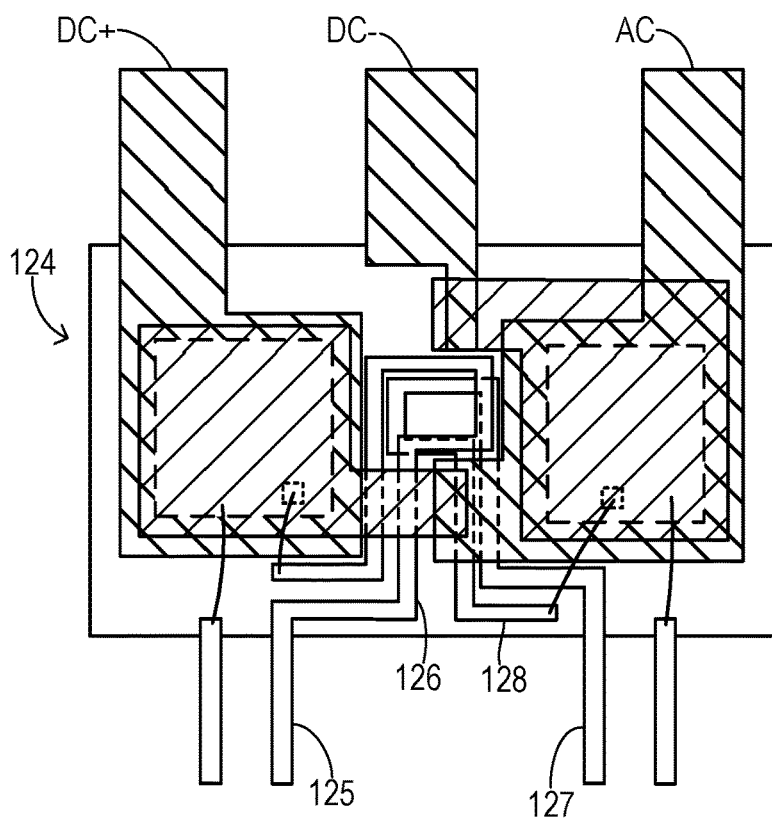
FIG. 12 is a plan view of another embodiment of a transfer-molded power module (TPM) of the invention wherein gate coils are implemented using a lead frame.

In FIG. 12, the gate coils are implemented using lead frame technology. Thus, a TPM power module 124 has a gate pin 125 wherein the lead frame extends into the module to form a gate coil 126 in the region of high flux variability. The lead frame also forms a gate pin 127 and a gate coil 128 in the region of high flux variability. After making connections by wire bonding as shown, the module is embedded with an encapsulating body of insulating material.

Figure 13:
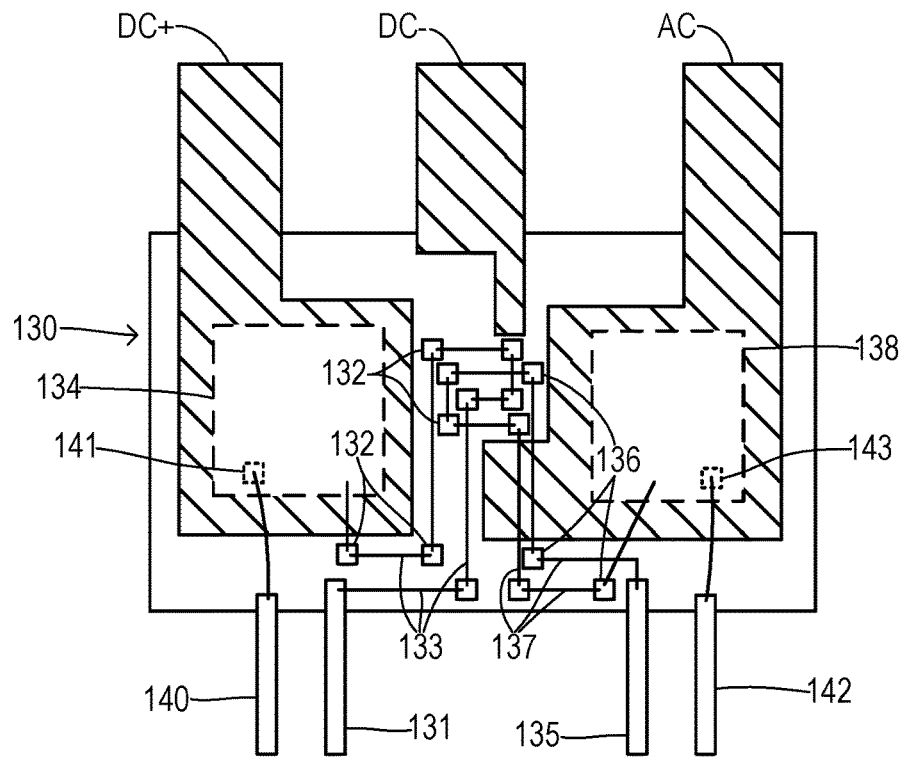
FIG. 13 is a plan view of another embodiment of a transfer-molded power module (TPM) of the invention wherein gate coils are implemented using bonded wires following a coil pattern of bonding pads on a substrate of the TPM.

In FIG. 13, the coils are implemented using bonded wires. In addition, the common source inductance is enhanced on the Kelvin emitter side of the gate circuit (i.e., between the driver ICs and the emitters of the IGBTs). A Kelvin emitter pin 131 connects to the emitter pad of an IGBT die 134 via a series of bonded wire segments (some of which are numbered 132) interconnecting respective ones of a plurality of bonding pads (some of which are numbered 133). Formed as part of a lead frame and encapsulated in the molded body, bonding pads 133 are at spaced positions along a coil pattern within the high-flux-variability region. Likewise, a Kelvin emitter pin 135 connects to the emitter pad of an IGBT die 138 via bonded wire segments 137 which follow a pattern according to bonding pads 136. In the embodiment of FIG. 13, gate pins 140 and 142 are connected to gate pads 141 and 143, respectively, using short bonded wires resulting in a low inductance on the gate side.

Figure 14:
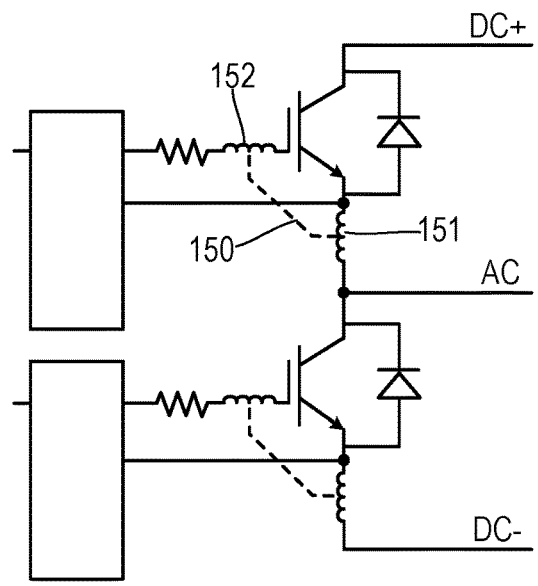
FIG. 14 is a schematic diagram showing an enhanced common source inductance introduced on the gate side within a gate drive circuit.
Figure 15:
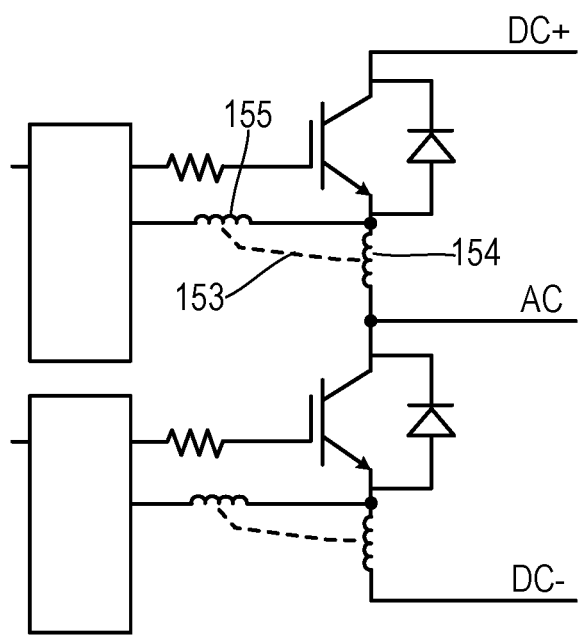
FIG. 15 is a schematic diagram showing an enhanced common source inductance introduced on the emitter side within a gate drive circuit.

FIG. 14 shows an enhanced common source inductance 150 wherein a power loop inductance 151 is closely coupled with an enhanced gate inductance 152. In contrast, FIG. 15 shows an alternative embodiment with an enhanced common source inductance 153 wherein a power loop inductance 154 is closely coupled with an enhanced Kelvin emitter inductance 155. In particular, the enhanced inductances are preferably obtained using coil turns arranged in a region where flux generated by currents in the power loop have a locally greatest rate of change. In each case, the gate drive coils convey the gate drive signals through the region that can most effectively obtain the desired enhancement. In other words, the structure for enhancing the common source inductance can be placed on the gate side (between a power module gate pin and the transistor die as shown in FIG. 14), on the emitter side (between a power module Kelvin emitter pin and the transistor die as shown in FIG. 15), or both.

What is claimed is:

1. A half-bridge power module comprising;
a body encapsulating a pair of transistor dies and positive, negative, and AC conductive tracks for carrying bridge currents;
a pair of gate drive pins projecting from the body; and
a pair of gate drive coils connecting a respective gate drive pin and transistor die, wherein each gate drive coil has at least one winding turn, and wherein the gate drive coils are encapsulated in a region disposed between the positive and negative conductive tracks containing a flux generated by the currents having a locally greatest rate of change.

2. The power module of claim 1 further comprising an auxiliary printed circuit board encapsulated in the body, wherein the gate drive coils are comprised of traces on the auxiliary printed circuit board.

3. The power module of claim 2 wherein the gate drive coils are disposed on opposite planar surfaces of the auxiliary printed circuit board.

4. The power module of claim 1 wherein the pair of gate drive pins are comprised of gate pins on a gate side of the transistor dies.

5. The power module of claim 1 wherein the pair of gate drive pins are comprised of Kelvin emitter pins on an emitter side of the transistor dies.

6. The power module of claim 1 further comprising a pair of gate clamping pins, each connected to a respective gate pad bypassing the gate drive coils.

7. The power module of claim 1 wherein the gate drive coils are comprised of conductors contained in a lead frame.

8. The power module of claim 1 wherein the gate drive coils include a plurality of bonding pads at spaced positions along a coil pattern within the region, and wherein the gate drive coils are further comprised of bonded wire segments interconnecting respective ones of the bonding pads.

9. The power module of claim 1 wherein the transistor dies each comprise an insulated gate bipolar transistor (IGBT).

10. A power converter comprising:
a DC link with positive and negative buses configured to receive a DC supply voltage;
a plurality of half-bridge power modules coupled between the buses, each power module comprising:
a body encapsulating a pair of transistor dies and positive, negative, and AC conductive tracks for carrying bridge currents;
a pair of gate drive pins; and
a pair of gate drive coils connecting a respective pin and die, wherein the gate drive coils are disposed in a region between the positive and negative tracks containing a flux generated by the currents having a locally greatest rate of change;
wherein the gate pins are turn-on pins for turning on the transistors, wherein each module further comprises a pair of gate turn-off pins for turning off the respective transistors, wherein each gate drive coil includes a plurality of turns, wherein each gate drive coil has an intermediate tap between two coil ends, wherein one of the turn-on pin or turn-off pin for each transistor is connected to the intermediate tap of the respective gate drive coil to obtain a first common source inductance and the other of the turn-on pin or turn-off pin for each transistor is connected to the coil ends to obtain a second common source inductance higher than the first common source inductance.

11. The power converter of claim 10 wherein each power module further comprises an auxiliary printed circuit board encapsulated in the body, wherein the gate drive coils are comprised of traces on the auxiliary printed circuit board.

12. The power converter of claim 11 wherein the respective gate drive coils are disposed on opposite planar surfaces of the respective auxiliary printed circuit board.

13. The power converter of claim 10 wherein the pair of gate drive pins are comprised of gate pins on a gate side of the transistor dies.

14. The power converter of claim 10 wherein the pair of gate drive pins are comprised of Kelvin emitter pins on an emitter side of the transistor dies.

15. The power converter of claim 10 wherein each power module further comprises a pair of gate clamping pins, each connected to a respective gate pad bypassing the gate drive coils.

16. The power converter of claim 10 wherein the gate drive coils are comprised of conductors contained in a respective lead frame.

17. A half-bridge power module comprising;
a pair of transistor dies connected to positive, negative, and AC conductive tracks for carrying bridge currents;
a pair of gate drive pins; and
a pair of gate drive coils connecting a respective pin and die, wherein the gate drive coils are disposed in a region between the positive and negative tracks containing a flux generated by the currents having a locally greatest rate of change;
wherein the pair of gate drive pins are comprised of gate pins on a gate side of the transistor dies; and
wherein the gate pins are turn-on pins for turning on the transistors, wherein the module further comprises a pair of gate turn-off pins for turning off the transistors, wherein each gate drive coil includes a plurality of turns, wherein each gate drive coil has an intermediate tap between two coil ends, wherein one of the turn-on pin or turn-off pin for each transistor is connected to the intermediate tap of the respective gate drive coil to obtain a first common source inductance and the other of the turn-on pin or turn-off pin for each transistor is connected to the coil ends to obtain a second common source inductance higher than the first common source inductance.

18. The power module of claim 17 further comprising an auxiliary printed circuit board, wherein the gate drive coils are comprised of traces on the auxiliary printed circuit board.

19. The power module of claim 18 wherein the gate drive coils are disposed on opposite planar surfaces of the auxiliary printed circuit board.

20. The power module of claim 18 further comprising an encapsulating body retaining the dies and auxiliary printed circuit board.

* * * * *